US010559478B2

(12) United States Patent
Kamada

(10) Patent No.: US 10,559,478 B2
(45) Date of Patent: Feb. 11, 2020

(54) METHOD FOR MANUFACTURING ELECTRONIC DEVICE AND ELECTRONIC DEVICE

(71) Applicant: SHINDENGEN ELECTRIC MANUFACTURING CO., LTD., Tokyo (JP)

(72) Inventor: Hideki Kamada, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 15/757,832

(22) PCT Filed: Dec. 26, 2016

(86) PCT No.: PCT/JP2016/088619
§ 371 (c)(1),
(2) Date: Mar. 6, 2018

(87) PCT Pub. No.: WO2018/122894
PCT Pub. Date: Jul. 5, 2018

(65) Prior Publication Data
US 2018/0342406 A1    Nov. 29, 2018

(51) Int. Cl.
*H01L 21/00* (2006.01)
*H01L 21/56* (2006.01)
(Continued)

(52) U.S. Cl.
CPC ............ *H01L 21/565* (2013.01); *B29C 39/10* (2013.01); *H01L 21/56* (2013.01); *H01L 23/16* (2013.01);
(Continued)

(58) Field of Classification Search
CPC .................................................. H01L 21/565
(Continued)

(56) References Cited

U.S. PATENT DOCUMENTS

2002/0173070 A1* 11/2002 Bolken ................ H01L 21/565
438/106
2010/0013085 A1   1/2010 Oi et al.
(Continued)

FOREIGN PATENT DOCUMENTS

JP    2003347484 A    12/2003
JP    2007165692 A     6/2007
(Continued)

OTHER PUBLICATIONS

International Search Report for PCT/JP2016/088619, dated Feb. 7, 2017, and its English translation provided by Bing Translator.
(Continued)

*Primary Examiner* — Ajay Arora
(74) *Attorney, Agent, or Firm* — Ladas & Parry, LLP

(57) ABSTRACT

Manufacturing method for an electronic device comprises a step of placing a substrate 10, which has a metal plate 11 on a back-surface side, on a back-surface-side mold 110 having a mold recessed part 111, a step of placing a front-surface-side mold 120 on the back-surface-side mold so as to cover the substrate 10; and a step of pouring resin between the front-surface mold 100 and the back-surface-side mold 110, when the substrate 10 is pressed against the back-surface-side mold 110. Circumferential part of the metal plate 11 is in contact with an edge of the mold recessed part 111 when the substrate 10 is pressed against the back-surface-side mold 110 in the step of pouring resin.

4 Claims, 5 Drawing Sheets

(51) Int. Cl.
*B29C 39/10* (2006.01)
*H01L 23/40* (2006.01)
*H01L 23/31* (2006.01)
*H01L 23/29* (2006.01)
*H01L 23/544* (2006.01)
*H01L 23/16* (2006.01)
*B29K 705/00* (2006.01)
*B29L 31/34* (2006.01)
*H01L 25/065* (2006.01)
*H01L 23/367* (2006.01)

(52) U.S. Cl.
CPC ........ *H01L 23/293* (2013.01); *H01L 23/3121* (2013.01); *H01L 23/4006* (2013.01); *H01L 23/544* (2013.01); *B29K 2705/00* (2013.01); *B29L 2031/3406* (2013.01); *H01L 23/367* (2013.01); *H01L 25/0655* (2013.01); *H01L 2023/405* (2013.01); *H01L 2023/4025* (2013.01); *H01L 2023/4087* (2013.01)

(58) Field of Classification Search
USPC .......................................... 257/687; 438/122
See application file for complete search history.

(56) References Cited

U.S. PATENT DOCUMENTS

| | | | |
|---|---|---|---|
| 2010/0133684 A1 | 6/2010 | Oka et al. | |
| 2016/0233146 A1* | 8/2016 | Nakamura | H01L 24/01 |

FOREIGN PATENT DOCUMENTS

| | | |
|---|---|---|
| JP | 2008022033 A | 1/2008 |
| JP | 2010027814 A | 4/2010 |
| JP | 2010129868 A | 6/2010 |
| JP | 2011077280 A | 4/2011 |
| JP | 2011238803 A | 11/2011 |
| JP | 2015115382 A | 6/2015 |
| JP | 2015173170 A | 10/2015 |
| JP | 2015185835 A | 10/2015 |

OTHER PUBLICATIONS

International Preliminary Examination Report for PCT/JP2016/088619, dated Aug. 21, 2017, and its English translation provided by Bing Translator.

Written Opinion for PCT/JP2016/088619, dated Feb. 7, 2017, and its English translation provided by Bing Translator.

* cited by examiner

METHOD FOR MANUFACTURING ELECTRONIC DEVICE AND ELECTRONIC DEVICE

The present application is the U.S. national phase of PCT Application PCT/JP2016/088619 filed on Dec. 26, 2016, the disclosure of which is incorporated herein by reference in its entirety.

TECHNICAL FIELD

The present invention relates to a method for manufacturing an electronic device and the electronic device.

BACKGROUND ART

Conventionally, when an electronic device such as a semiconductor device is manufactured, potting in which resin is simply poured or transfer molding in which pressure is applied to pour resin is used. In this respect, potting is often used for a molded product where a little load is applied to an electronic element such as a semiconductor chip and a wire connected to the electronic element, the molded product having a complicated shape or many mounted components.

In addition, a heatsink is provided on the back surface of a sealing part of a semiconductor device (for example, see JP 2015-115382 A). A configuration is considered wherein the heatsink is embedded in the back surface of the sealing part. However, if potting is used in a case of embedding the heatsink in the back surface of the sealing part as described above, there is a likelihood that resin used in the sealing part will flow to the back surface of the heatsink.

SUMMARY OF INVENTION

Technical Problem

In view of the above point, the present invention provides a method for manufacturing an electronic device and the electronic device capable of reducing the likelihood that resin will flow to a back-surface side of a metal plate provided on a back-surface side of a substrate.

Solution to Problem

A manufacturing method for an electronic device, according to one embodiment of the present invention, may comprise:

a step of placing a substrate, which has a metal plate on a back-surface side, on a back-surface-side mold having a mold recessed part;

a step of placing a front-surface-side mold on the back-surface-side mold so as to cover the substrate; and a step of pouring resin between the front-surface mold and the back-surface-side mold, while the substrate is pressed against the back-surface-side mold, wherein circumferential part of the metal plate is in contact with an edge of the mold recessed part, when the substrate is pressed against the back-surface-side mold in the step of pouring resin.

In the manufacturing method for an electronic device, according to one embodiment of the present invention, the metal plate may have a metal body part and a metal thinned part provided on circumference of the metal body part and thinner than the metal body part the metal thinned part may be located outward of circumference of the mold recessed part and the metal body part is in contact with the edge of the mold recessed part, when the metal plate is pressed against the back-surface-side mold in the step of pouring resin.

In the manufacturing method for an electronic device, according to one embodiment of the present invention, an insertion part for inserting a fastening member may be placed on a front surface of the substrate, an elastic body may be positioned on a top part of the insertion part, and the metal plate may be pressed against the back-surface-side mold by pressing the elastic body to the top part of the insertion part.

In the manufacturing method for an electronic device, according to one embodiment of the present invention, an electronic element may be provided on the substrate placed on the back-surface-side mold, and a terminal may be connected to the electronic element An electronic device, according to one embodiment of the present invention, may comprise:

a substrate having a metal plate on a back-surface side;

an electronic element provided on the substrate; and a sealing part made of a resin material for sealing the electronic element, wherein a back surface of the metal plate may be exposed outside from the sealing part, and wherein a pressing mark may be formed on a circumferential part of the back surface of the metal plate.

In the electronic device, according to one embodiment of the present invention, an entire side surface, an entire front surface and an entire circumferential part compared with the metal plate in a back surface side of the sealing part may be exposed to outside.

Effect of Invention

In the present invention, the circumferential part of the metal plate is in contact with the edge of the mold recessed part while the metal plate is pressed against the back-surface-side mold in the step of pouring resin. Therefore, the likelihood that resin flows to the back surface of the metal plate can be reduced.

DESCRIPTION OF EMBODIMENTS

Embodiment

<<Configuration>>

Figure 1:
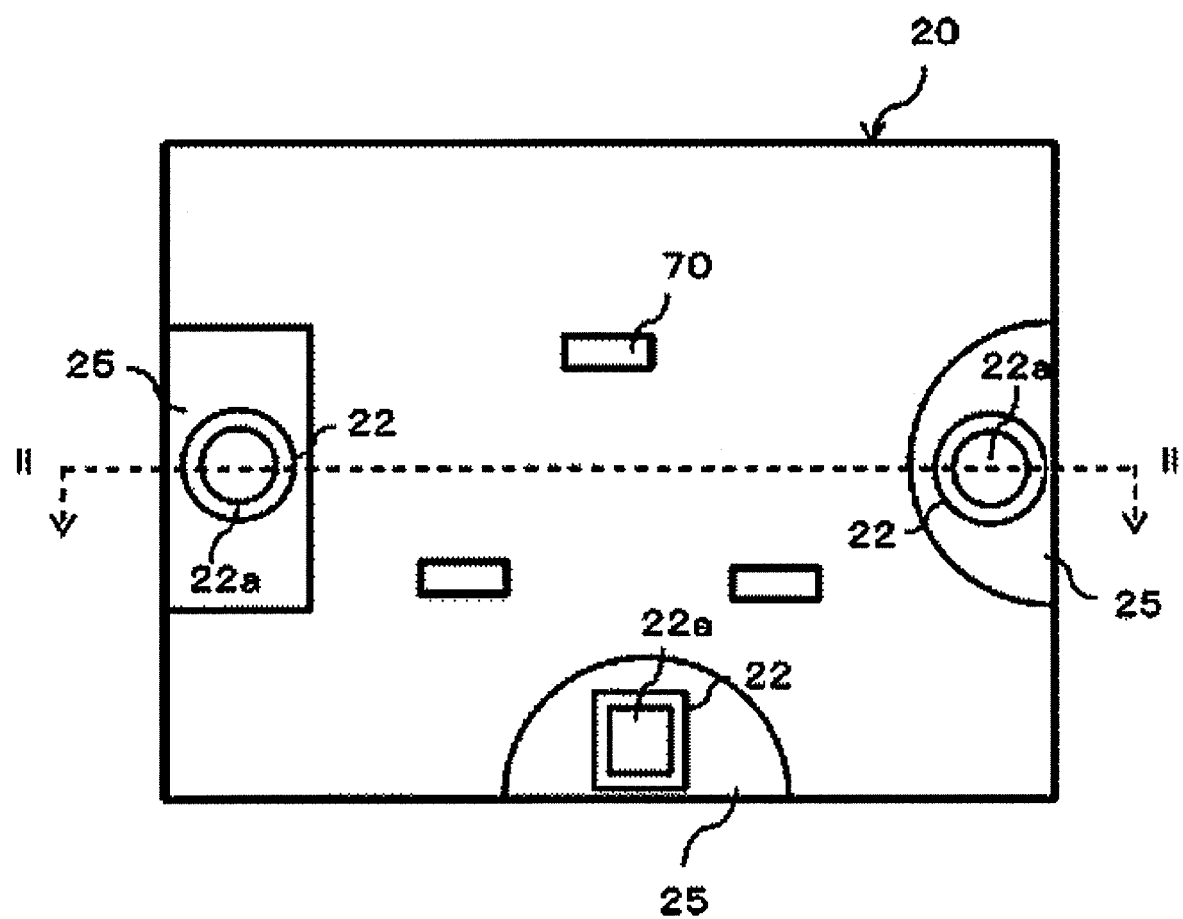
FIG. 1 is a plan view of an electronic device according to an embodiment of the present invention.
Figure 2:
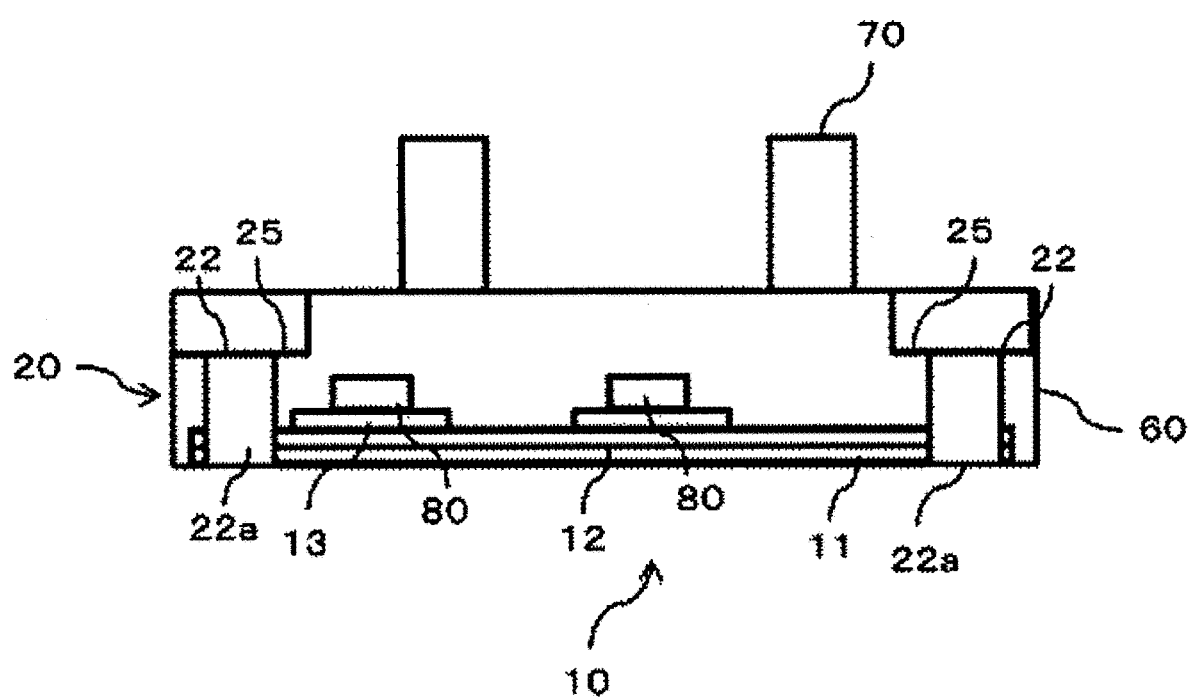
FIG. 2 is a side sectional view of the electronic device according to the embodiment of the present invention taken along line II-II in FIG. 1.

As illustrated in FIG. 2, an electronic device of the present embodiment may have a substrate 10, an electronic element 80 such as a semiconductor element provided on the substrate 10 with a conductor layer 13 to be described later interposed therebetween, and a sealing part 20 made of a resin material for sealing the electronic element 80. As illustrated in FIG. 1, the sealing part 20 may have an insertion part 22 for inserting a fastening member 90 such as a screw. The insertion part 22 may be provided in a sealing recessed part 25 recessed compared with a circumferential region. The insertion part 22 may be made of a metal material, and an insertion hole 22a into which the fastening member 90 is inserted may be provided at the center of the insertion part 22. The insertion part 22 may be threaded to engage with the fastening member 90.

In the present embodiment, a semiconductor device can be given as an example of the electronic device, and a semiconductor element can be given as an example of the electronic element 80. However, the present invention is not limited to them, and it is not necessary to use a "semiconductor".

As illustrated in FIG. 2, the substrate 10 may have a metal plate 11, an insulating layer 12 provided on the metal plate 11, and a conductor layer 13 provided on the insulating layer 12. In addition, a circuit may be formed by patterning the conductor layer 13 on the insulating layer 12. The metal plate 11 may function as a heatsink. The metal plate 11 and the conductor layer 13 may be made of copper, for example.

Figure 4:
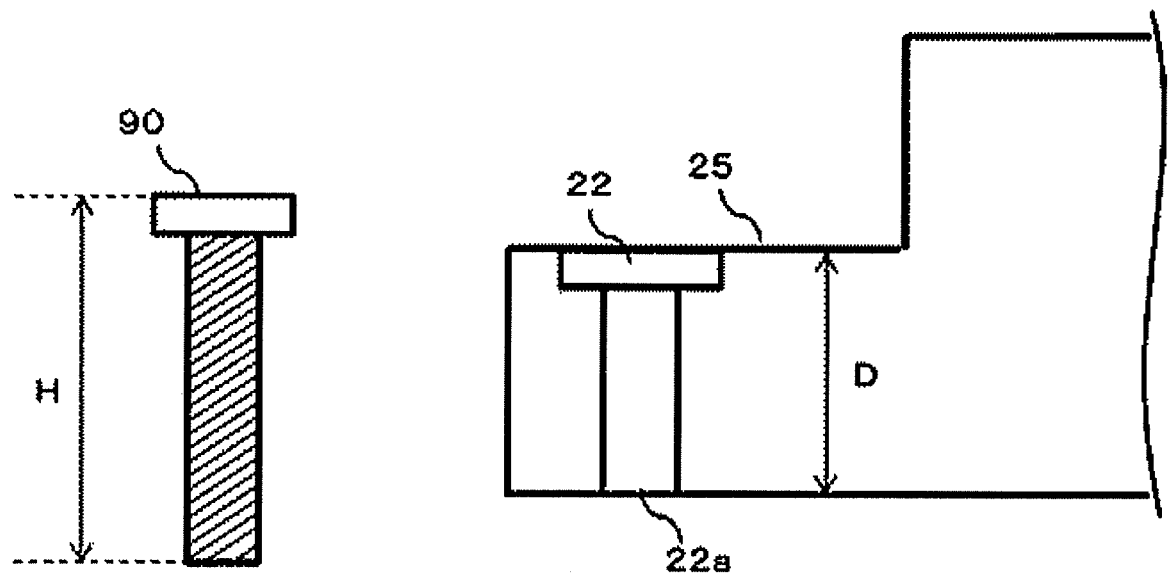
FIG. 4 is a side sectional view illustrating the electronic device and a fastening member according to the embodiment of the present invention in an enlarged manner.

As illustrated in FIG. 4, depth D of the insertion part 22 may correspond to length H of the fastening member 90. The depth D of the insertion part 22 "corresponds to length H of the fastening member 90" means that the depth D of the insertion part 22 is shorter than the length H of the fastening member 90 by a predetermined length (for example, $0.7 \times H \leq D \leq 0.9H$), and the depth D is set so that there is no problem in inserting the fastening member 90 into the insertion part 22 and fixing the electronic device at a predetermined location.

At least the side surface of the sealing part 20 and the sealing recessed part 25 may be exposed to the outside. In addition, the entire side surface and the entire front surface of the sealing part 20 may be exposed to the outside. "Exposed to the outside" means that there is no frame body surrounding the electronic device, and means that the electronic device is a so-called caseless device. The aspect illustrated in the drawings of the present embodiment is a caseless aspect.

As illustrated in FIG. 2, a terminal 70 connected to the electronic element 80 and protruding to the outside from the front surface of the sealing part 20 may be provided. In addition, the terminal 70 may be straight without being bent. In the case where the terminal 70 described above is provided, sealing is generally performed by potting in which less pressure is applied.

Figure 3:
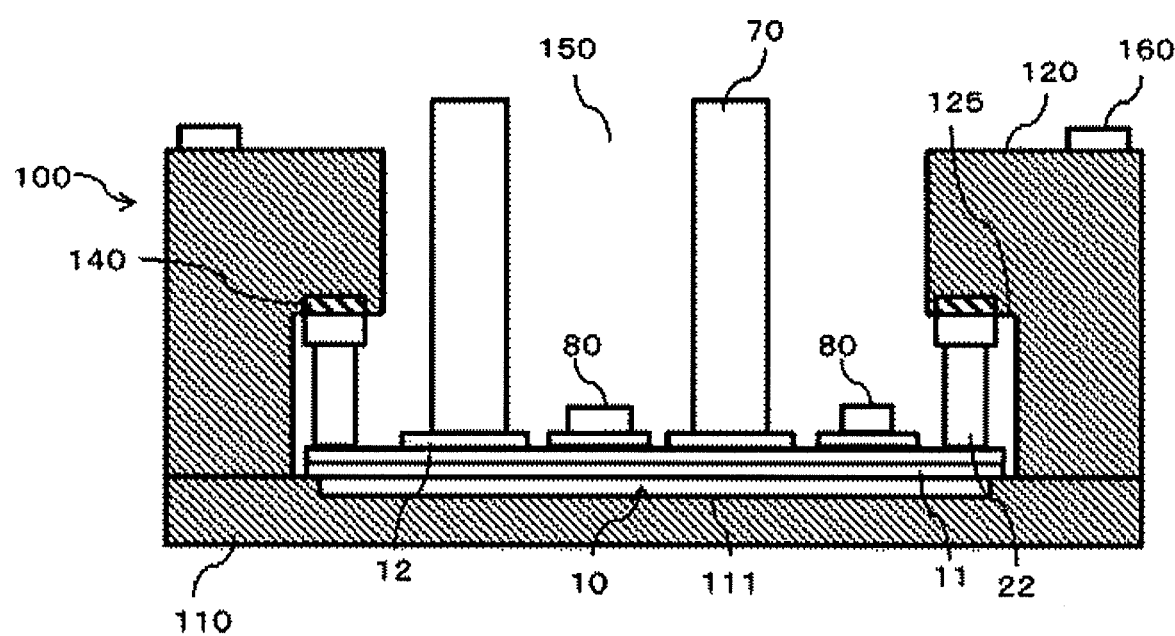
FIG. 3 is a side sectional view illustrating an aspect when the electronic device according to the embodiment of the present invention is manufactured.

As illustrated in FIG. 3, a mold 100 may have a back-surface-side mold 110 and a front-surface-side mold 120 placed on the front surface of the back-surface-side mold 110. The back-surface-side mold 110 and the front-surface-side mold 120 may be connected by a fastening member 160. The front-surface-side mold 120 may have a projecting part 125 corresponding to the sealing recessed part 25 of the electronic device.

The front-surface-side mold 120 may have an elastic body 140 such as packing positioned so as to come into contact with a top part of the insertion part 22. When the front-surface-side mold 120 is fastened to the back-surface-side mold 110 with the fastening member 160, the elastic body 140 is pressed against the top part of the insertion part 22. As a result, the metal plate 11 is pressed against the back-surface-side mold 110.

The front-surface-side mold 120 may be provided with an opening 150 for potting resin. Resin sealing is performed by potting resin from the opening 150 of the front-surface-side mold 120 after the substrate 10, the electronic element 80, the insertion part 22, the terminal 70 and the like are placed in the mold 100

The back-surface-side mold 110 may have a mold recessed part 111 facing the back surface of the metal plate 11. In the case of adopting the back-surface-side mold 110 described above, the circumferential part of the metal plate 11 of the substrate 10 may come into contact with an edge of the mold recessed part 111. The circumferential part of the metal plate 11 means part of the metal plate 11 that is within a distance of ⅛ of the length in the lateral direction or the length in the longitudinal direction of the metal plate 11 from the outermost circumference of the metal plate 11. That is, the circumferential part in the lateral direction means part within the distance of ⅛ of the length in the lateral direction, and the circumferential part in the longitudinal direction means part within the distance of ⅛ of the length in the longitudinal direction. In addition, in a case where the length of the metal plate 11 in the lateral direction is equal to or greater than a predetermined length (for example, 24 cm), part of the metal plate 11 within a predetermined distance (for example, within a distance of 3 cm) from the outermost circumference may be the circumferential part. As an example, a region from 0.5 mm to the distance equal to the thickness of the metal plate 11 from the outermost circumference of the metal plate 11 (more specifically, a location at 1 mm from the outermost circumference of the metal plate 11) may come into contact with the edge of the mold recessed part 111.

Figure 5:
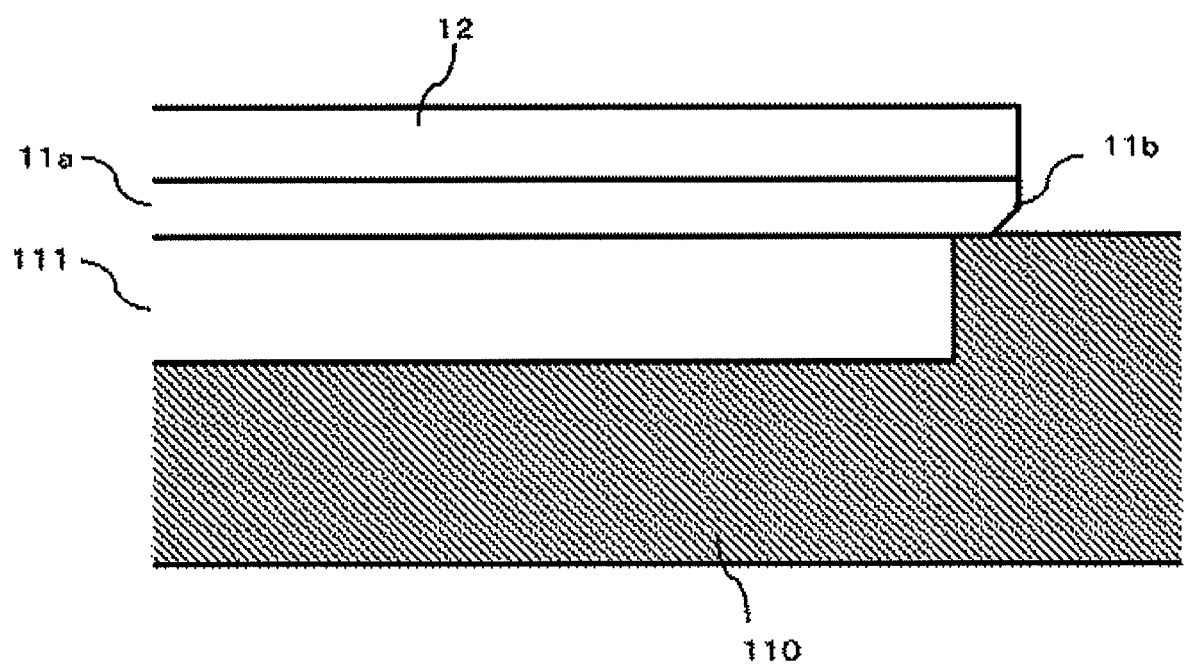
FIG. 5 is a side-view sectional view enlarging a circumferential part of a metal plate and a mold recessed part used in the embodiment of the present invention.

As illustrated in FIG. 5, the metal plate 11 of the substrate 10 may have a metal body part 11a, and a metal thinned part 11b provided on the circumference of the metal body part 11a and thinner than the metal body part 11a. In the case of adopting the metal plate 11 having the above-described shape, the metal thinned part 11b may be located outward of the circumference of the mold recessed part 111 when resin is poured into the mold 100. The metal body part 11a may have a substantially quadrangular cross section. The metal thinned part 11b may gradually become thinner as it proceeds outward of the circumference. The metal thinned part 11b may be gradually thinned on a front-surface side, may be gradually thinned on a back-surface side (see FIG. 5), or may be gradually thinned on both the front-surface side and the back-surface side.

In a case where the circumferential part of the metal plate 11 of the substrate 10 is pressed against the edge of the mold recessed part 111 of the back-surface-side mold 110 with a strong force, a pressing mark is formed on the circumferential part of the back surface of the metal plate 11. That is, in a case where the mold recessed part 111 as illustrated in the present embodiment is adopted and the circumferential part of the metal plate 11 is pressed against the edge of the mold recessed part 111 with a strong force, a pressing mark is formed on the circumferential part of the back surface of the metal plate 11. In contrast, in a case where a mold 100 not having the mold recessed part 111 as in the present embodiment is used, it is unlikely that a pressing mark or the like will be formed on the circumferential part of the back surface of the metal plate 11. Therefore, it is highly likely that an electronic device having a metal plate 11 with a pressing mark as described above adopts a mold recessed part 111.

In addition, in the case of adopting an aspect in which the sealing recessed part 25 is appropriately provided, the degree of freedom of design can be increased. As an example, in a case where an aspect in which the insertion part 22 is provided in the sealing recessed part 25 and the depth D of the insertion part 22 corresponds to the length H of the fastening member 90 (see FIG. 4), the thickness of the sealing recessed part 25 can be easily adjusted to a thickness corresponding to the length of the fastening member 90 and the length of the insertion part 22. Therefore, electronic devices of different types and forms can use identical fastening members 90 by setting the thickness of each sealing recessed part 25 to substantially an identical value, for example, a value within ±5% of the average value D0: D0× (1±0.05). As a result, it is possible to standardize parts, to reduce manufacturing costs, and to eliminate the risk of mix-up of parts in advance.

<<Manufacturing Method>>

Next, processes for manufacturing an electronic device (a method for manufacturing an electronic device) according to the present embodiment having the above-described configuration will be described. Any aspect described in "Configuration", which will be an overlapping description and therefore will not be stated, can be applied.

The substrate 10 having the electronic element 80 and the terminal 70 arranged on the conductor layer 13 on a front-surface side and the metal plate 11 on a back-surface side is placed on the back-surface-side mold 110 having the mold recessed part 111 (substrate placing process). At that time, the center of the mold recessed part 111 and the center of the metal plate 11 may be aligned, and the circumferential part of the metal plate 11 may come into contact with the edge of the mold recessed part 111.

Next, the insertion part 22 for inserting the fastening member 90 is placed (insertion part placing process). Note that the process of placing the insertion part 22 may be performed simultaneously with or before the process of placing the electronic element 80 and/or the terminal 70 on the conductor layer 13.

Next, the front-surface-side mold 120 is placed on the back-surface-side mold 110 so as to cover entirety of the substrate 10, and the front-surface-side mold 120 is fixed to the back-surface-side mold 110 by the fastening member 160. By fixing the front-surface-side mold 120 to the back-surface-side mold 110 by the fastening member 160 as described above, the substrate 10 is pressed against the back-surface-side mold 110. At that time, by adjusting fastening force, of the fastening member 160, magnitude of pressure for pressing the substrate 10 against the back-surface-side mold 110 may be adjusted.

Next, resin is poured between the front-surface mold 100 and the back-surface-side mold 110 for example, by potting (resin inflow process). At that time, the metal plate 11 is pressed against the back-surface-side mold 110 in a state where the circumferential part of the metal plate 11 of the substrate 10 is in contact with the edge of the mold recessed part 111. Therefore, a strong pressure can be applied to the metal plate 11 by the edge of the mold recessed part 111, and the likelihood that resin will flow to the back surface of the metal plate 11 can be reduced. Note that prior to pouring of resin by potting, the mold 100 may be warmed to about 85° C. by a preheating unit (preheating plate), and while resin is poured, the mold 100 may be warmed by the preheating unit (preheating plate) set at about 75° C. Performing preheating as described above is advantageous in that it is possible to prompt resin to flow to the outer circumference of the sealing recessed part 25.

In a case where the front-surface mold 100 has the elastic body 140, in the resin inflow process, the insertion part 22 for inserting the fastening member 90 is placed on the front surface of the substrate 10, and the elastic body 140 of the front-surface-side mold 120 is positioned on the top part of the insertion part 22. Then, by pressing the top part of the insertion part 22 by the bottom surface of the projecting part 125 of the front-surface-side mold 120, the substrate 10 is pressed against the back-surface-side mold 110 in a state where the circumferential part of the metal plate 11 is in contact with the edge of the mold recessed part 111. In this state, resin to be material of the sealing part 20 is poured into the mold 100. By using the elastic body 140 described above, the substrate 10 can be pressed against the edge of the mold recessed part 111 by also using elastic force (repulsive force) of the elastic body 140. As a result, the likelihood that resin will flow to the back surface of the metal plate 11 can be further reduced.

The location where the metal plate 11 is pressed by a pressing member such as the insertion part 22 may be peripherally inside the mold recessed part 111. By pressing the metal plate 11 at the location described above, the metal plate 11 can be pushed in such that the metal plate 11 bends into the mold recessed part 111, which is advantageous in that the likelihood that resin will flow to the back surface of the metal plate 11 can be further reduced.

The location where the metal plate 11 is pressed by the pressing member such as the insertion part 22 may be a plurality of portions intermittently arranged or may be continuous portions. By adopting such an aspect, the metal plate 11 can be more reliably pressed against the back-surface-side mold 110, and the likelihood that resin will flow to the back surface of the metal plate 11 can be further reduced.

In addition, in a case where there is a plurality of portions where the metal plate 11 is pressed by the pressing member such as the insertion part 22, the portions may be arranged at equal intervals or may be arranged line-symmetrically or point-symmetrically. By adopting such an aspect, the metal plate 11 can be pressed against the back-surface-side mold 110 in a more balanced manner, and the likelihood that resin will flow to the back surface of the metal plate 11 can be further reduced.

Note that in a case where the sealing part 20 has a substantially quadrangular shape in plan view, the insertion part 22 may be provided correspondingly to each side, or the insertion parts 22 may be provided on a pair of sides facing each other. Note that in a case where the sealing part 20 has a substantially rectangular shape in plan view, the insertion parts 22 may be provided on a pair of short sides, or the insertion parts 22 may be provided on a pair of long sides. Note that a "substantially quadrangular shape in plan view" means an aspect in which sides facing each other are parallel in plan view, and includes an aspect in which a corner part is rounded in plan view. A "substantially rectangular shape in plan view" means an aspect in which sides facing each other are parallel in plan view and there are short sides and long sides, and includes an aspect in which a corner part is rounded in plan view. By appropriately changing the location of the insertion part 22 according to the size and the shape of the product, the portion of the metal plate 11, pressed by the insertion part 22 can be appropriately changed, and the likelihood that resin will flow to the back surface of the metal plate 11 can be further reduced. For example, when an aspect in which the insertion parts 22 are provided on a pair of short sides is adopted (when an aspect in which the circumferential part on the right side surface and the circumferential part on the left side surface in FIG. 1 are pressed is adopted) in a case where the sealing part 20 has a substantially rectangular shape in plan view, this aspect is advantageous in that the metal plate 11 can be pressed against the circumference of the mold recessed part 111 at portions the length between which is long and where the influence of warping or the like of the metal plate 11 is likely to appear.

In a case where an aspect in which the metal plate 11 has the metal body part 11a and the metal thinned part 11b thinner than the metal body part 11a is adopted, in the resin inflow process, the metal plate 11 may be pressed against the back-surface-side mold 110 in a state where the metal thinned part 11b is located outward of the mold recessed part 111 and the metal body part 11a is in contact with the edge of the mold recessed part 111. By pressing the thick metal body part 11a against the edge of the mold recessed part 111 as described above, the likelihood that resin will flow to the back surface of the metal plate 11 can be further reduced.

This point will be explained. The metal plate 11 may have the metal body part 11a having a substantially quadrangular cross section and the metal thinned part 11b becoming thinner toward the circumference. In a case where the metal thinned part 11b is pressed against the edge of the mold recessed part 111 in a case where the metal plate 11 described above is used, since the shape of the metal thinned part 11b is not uniform, resin sometimes flows to the back-surface side of the metal plate 11 through a gap inevitably formed between the metal thinned part 11b and the mold recessed part 111. In this respect, as in the present aspect, by pressing the metal body part 11a against the edge of the mold recessed part 111, the metal body part 11a having a substantially quadrangular cross section and having a shape close to a uniform shape, the likelihood that resin will flow to the back-surface side of the metal plate 11 can be further reduced.

As described above, when resin is poured into the mold 100, for example, by potting, the resin is cured at a predetermined temperature to form the sealing part 20 (curing process).

Next, by removing the mold 100, a caseless electronic device in which the entire side surface and the entire front surface of the sealing part 20 are exposed to the outside is manufactured.

The description of the embodiment and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like.

10 Substrate
11 Metal plate
11a Metal body part
11b Metal thinned part
20 Sealing part
22 Insertion part
70 Terminal
80 Electronic element
90 Fastening member
110 Back-surface-side mold
111 Mold recessed part
120 Front-surface-side mold
140 Elastic body

The invention claimed is:

1. A manufacturing method for an electronic device comprising:
    a step of placing a substrate, which has a metal plate on a back-surface side, on a back-surface-side mold having a mold recessed part;
    a step of placing an insertion part for inserting a fastening member on a front surface of the substrate and peripherally inside the mold recessed part;
    a step of placing a front-surface-side mold on the back-surface-side mold so as to cover the substrate; and
    a step of pouring resin by potting between the front-surface mold and the back-surface-side mold, while the substrate is pressed against the back-surface-side mold,
    wherein the metal plate is pressed against the back-surface-side mold by pressing a top part of the insertion part and circumferential part, peripherally outside the insertion part, of the metal plate is in contact with an edge of the mold recessed part, when the substrate is pressed against the back-surface-side mold in the step of pouring resin,
    wherein the metal plate has a central metal body part surrounded by a peripheral metal thinned part surrounding the metal body part and which is thinner than the metal body part,
    wherein the metal thinned part is located outward of circumference of the mold recessed part and the metal body part is in contact with an edge of the circumference of the mold recessed part, when the metal plate is pressed against the back-surface-side mold in the step of pouring resin.

2. A manufacturing method for an electronic device comprising:
    a step of placing a substrate, which has a metal plate on a back-surface side, on a back-surface-side mold having a mold recessed part;
    a step of placing an insertion part for inserting a fastening member on a front surface of the substrate and peripherally inside the mold recessed part;
    a step of placing a front-surface-side mold on the back-surface-side mold so as to cover the substrate; and
    a step of pouring resin by potting between the front-surface mold and the back-surface-side mold, while the substrate is pressed against the back-surface-side mold,
    wherein the metal plate is pressed against the back-surface-side mold by pressing a top part of the insertion part and circumferential part, peripherally outside the insertion part, of the metal plate is in contact with an edge of the mold recessed part, when the substrate is pressed against the back-surface-side mold in the step of pouring resin,
    wherein an elastic body is positioned on the top part of the insertion part, and
    wherein the metal plate is pressed against the back-surface-side mold by pressing the elastic body to the top part of the insertion part.

3. The manufacturing method for an electronic device according to claim 1,
    wherein an electronic element is provided on the substrate placed on the back-surface-side mold, and a terminal is connected to the electronic element.

4. The manufacturing method for an electronic device according to claim 2,
wherein an electronic element is provided on the substrate placed on the back-surface-side mold, and a terminal is connected to the electronic element.

* * * * *